(12) United States Patent  (10) Patent No.: US 6,734,482 B1
Tran et al.  (45) Date of Patent: May 11, 2004

(54) TRENCH BURIED BIT LINE MEMORY DEVICES

(75) Inventors: Luan C. Tran, Meridian, ID (US); Mark Durcan, Boise, ID (US); Howard C. Kirsch, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/295,106

(22) Filed: Nov. 15, 2002

(51) Int. Cl.$^7$ ............................................. H01L 27/108
(52) U.S. Cl. ....................................... 257/296; 257/300
(58) Field of Search ................................. 257/296, 300

(56) References Cited

U.S. PATENT DOCUMENTS

| | | |
|---|---|---|
| 5,702,969 A | 12/1997 | Lee |
| 5,736,761 A | 4/1998 | Risch et al. |
| 5,753,551 A | 5/1998 | Sung |
| 5,792,685 A | 8/1998 | Hammerl et al. |
| 5,858,833 A | 1/1999 | Lee et al. |
| 6,048,767 A | 4/2000 | Terada |
| 6,127,228 A | 10/2000 | Lee |
| 6,218,236 B1 | 4/2001 | Economikos et al. |
| 6,243,311 B1 | 6/2001 | Keeth |
| 6,261,908 B1 | 7/2001 | Hause et al. |
| 6,303,424 B1 | 10/2001 | Lee et al. |
| 6,306,703 B1 | 10/2001 | Noble |
| 6,335,237 B1 | 1/2002 | Tang et al. |
| 6,344,389 B1 | 2/2002 | Bronner et al. |
| 6,373,138 B1 | 4/2002 | Noble |
| 6,417,048 B1 * | 7/2002 | Tseng ........................ 438/259 |
| 6,455,886 B1 * | 9/2002 | Mandelman et al. ....... 257/301 |
| 6,555,862 B1 * | 4/2003 | Mandelman et al. ....... 257/301 |

* cited by examiner

*Primary Examiner*—David Nelms
*Assistant Examiner*—Tu-Tu Ho
(74) *Attorney, Agent, or Firm*—Dinsmore & Shohl LLP

(57) ABSTRACT

A memory device such as a $6F^2$ memory device includes isolation trenches that are formed generally parallel to and along associated strips of active area. A conductive bit line is recessed within each isolation trench such that the uppermost surface of the bit line is recessed below the uppermost surface of the base substrate. A bit line contact strap electrically couples the bit line to the active area both along a vertical dimension of the bit line strap and along a horizontal dimension across the uppermost surface of the base substrate.

49 Claims, 14 Drawing Sheets

TRENCH BURIED BIT LINE MEMORY DEVICES

BACKGROUND OF THE INVENTION

The present invention relates in general to memory devices and in particular to memory devices having conductive lines buried in isolation regions.

Dynamic random access memory (DRAM) memory has enjoyed popular success over other types of memory technology because of its low cost and simple memory cell layout, which promotes scalability. A DRAM memory cell is capable of storing one bit of information and is constructed using only one memory cell transistor and one memory cell capacitor. As such, this memory cell is often referred to as a one-transistor one-capacitor (1T1C) cell. In a typical memory device, collections of 1T1C memory cells are grouped together by bit lines and word lines forming a memory array.

The industry is continually striving to produce DRAM memory devices that provide increased storage capacity, yet provide comparable to improved operational performance. Increase in circuit density is often the result of an ability to manufacture a given device in a smaller physical space than previously possible, allowing an increase in packing density. However, device density in DRAM memory is limited by both the resolution capability of available photolithographic equipment (feature size) and the area consumed by each memory cell in a given memory array.

One known DRAM memory device stacks storage capacitors above memory cells. For example, memory cells are fabricated by forming word line gate stacks over a semiconductor substrate. Bit lines are subsequently fabricated by forming a metal line in a passivating insulating layer over the semiconductor substrate. A bit line is electrically coupled to an associated memory cell by forming a via that passes through one or more layers of the memory device to a bit line contact on the semiconductor substrate. Capacitor structures are also formed over the semiconductor substrate and are electrically coupled an associated memory cell by forming a via through one or more semiconductor layers. As such, for each memory cell, one via is required to connect the bit line to the memory cell and a second via is required to connect the capacitor structure to the memory cell. Under such an arrangement, the capacitor is typically stacked over the bit line. However, this requires a relatively deep via having contact openings that are difficult to form and hard to fill. For example, poor step coverage and adhesion may occur resulting in poor electrical performance and increased contact resistance. Accordingly, there is a continuing need for improved memory.

The amount of charge that a storage capacitor can store is generally related to the amount of storage node surface area. As DRAM dimensions grow smaller, there is an ever-increasing need to maintain storage capacitance values despite more tightly packed circuits. However, the minimum realizable area of the vias required to connect the bit line and capacitor to the memory cell is limited by the minimum realizable feature size. Accordingly, for a given area, space that would otherwise be available for capacitor structures is required to provide the bit line and bit line contacts. As packing density in DRAM structures increases, the via size thus serves to limit the area available for capacitor structures. Accordingly, there is a continuing need for improved or alternative memory device structures.

SUMMARY OF THE INVENTION

The present invention overcomes the disadvantages of previously known semiconductor devices by providing a memory device with a trench buried bit line.

According to one embodiment of the present invention, a memory device such as a $6F^2$ memory device includes isolation trenches that are formed generally parallel to and along associated strips of active area. A conductive bit line is recessed within each isolation trench such that the uppermost surface of the bit line is recessed below the uppermost surface of the base substrate. A bit line contact strap electrically couples the bit line to the active area both along a vertical dimension of the bit line strap and along a horizontal dimension across the uppermost surface of the base substrate.

BRIEF DESCRIPTION OF THE SEVERAL VIEWS OF THE DRAWINGS

The following detailed description of the preferred embodiments of the present invention can be best understood when read in conjunction with the following drawings, where like structure is indicated with like reference numerals and in which.

DETAILED DESCRIPTION OF THE PREFERRED EMBODIMENTS

In the following detailed description of the preferred embodiments, reference is made to the accompanying drawings that form a part hereof, and in which is shown by way of illustration, and not by way of limitation, specific preferred embodiments in which the invention may be practiced. It is to be understood that other embodiments may be utilized and that logical, mechanical and electrical changes may be made without departing from the spirit and scope of the present invention.

Preliminarily, the process steps and structures described herein do not form a complete process flow for manufacturing integrated circuits. Rather, the present invention can be practiced in conjunction with a variety of integrated circuit fabrication techniques, including those techniques currently known or used in the art. As such, not all commonly practiced process steps are disclosed herein. Certain commonly practiced process steps are included in the description herein for example, to provide contextual reference, for illustrative or exemplary purposes, or as is necessary for an understanding of the present invention.

Also, as used herein, the formation of a layer or region "over" a substrate or other layer refers to formation above, or in contact with, a surface of the substrate or layer. For example, where it is noted or recited that an insulating layer is formed over a substrate, it is contemplated that intervening structural layers may optionally be present between the insulating layer and the substrate.

It will be appreciated that the construction of a $6F^2$ memory device discussed with reference to the Figures herein is for the purpose of facilitating discussion of the present invention. It is not limiting in the manner or application of the various embodiments of the present invention herein. It will also be appreciated that at times, the description herein will refer to various formations including for example, wells, regions and devices as being either a first type or a second type. The designation of a first type and a second type is used to merely differentiate the structures, being discussed. For example, a first type structure may comprise an N-type structure and a second type structure may comprise a P-type structure. Likewise, a first type structure may comprise a P-type structure and a second type structure may comprise an N-type structure.

Figure 1:
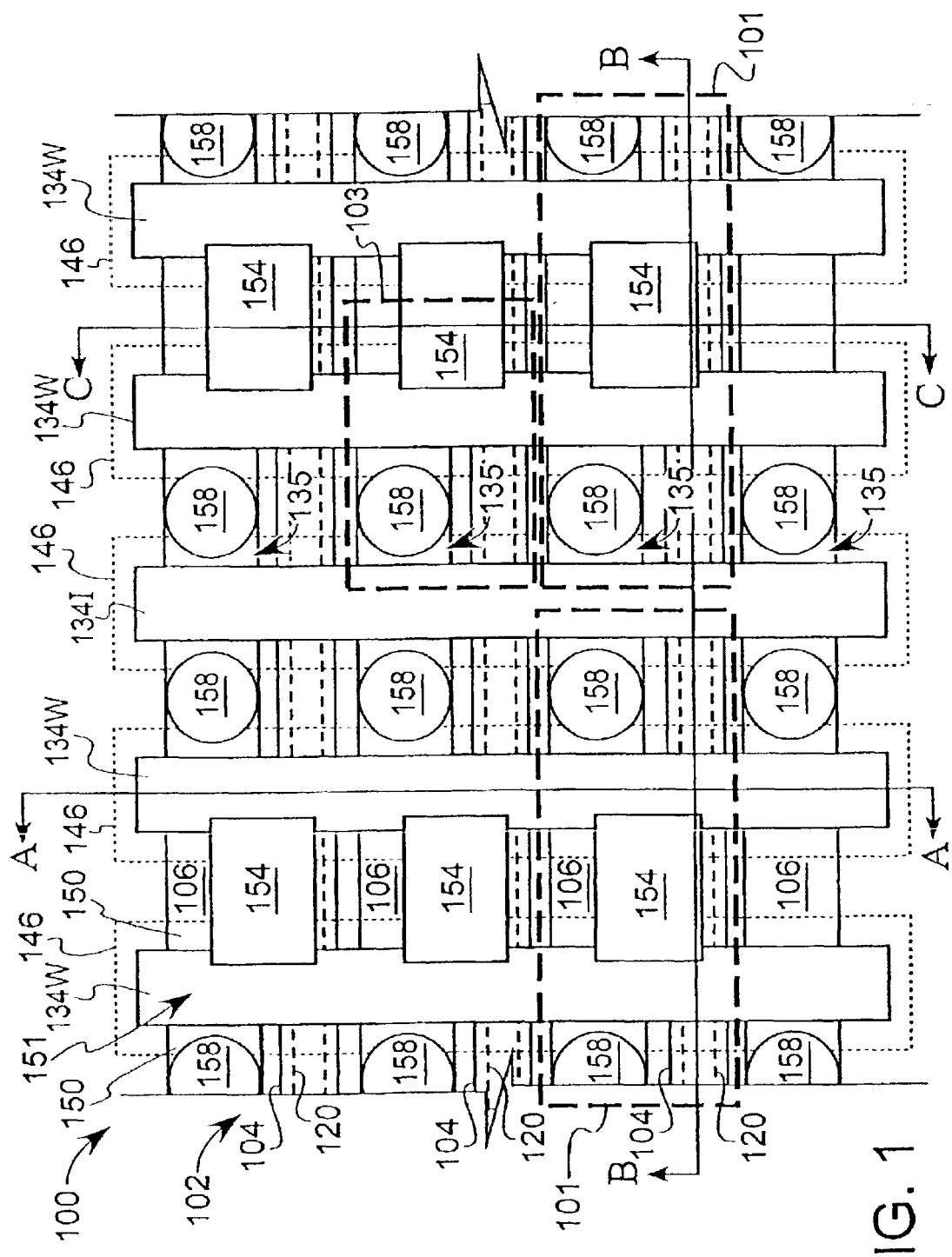
FIG. 1 is a schematic top view of a portion of a memory device with a trench bit line according to one embodiment of the present invention.

Referring initially to FIG. 1, a top view of a portion of a $6F^2$ memory array 100 according to one embodiment of the present invention is illustrated. The memory array 100 includes a base substrate 102 having a plurality of strips of active area 106. Each strip of active area 106 is suitably doped to define a plurality of source/drain regions 150 separated by channel regions 151. In FIG. 1, the source/drain regions 150 are formed in the strips of active area 106 adjacent to the word lines 134W and isolation device 134I. The channel regions 151 are formed in the strips of active area 106 underneath the word line 134W and the isolation device 134I.

Isolation regions 104 are formed as elongate trenches or strips of isolation generally parallel to and along side the strips of active area 106 such that there is an isolation region 104 spaced between adjacent strips of active area 106. A bit line 120 is recessed within each isolation region 104 and is thus illustrated with dashed lines to indicate that each bit line 120 is buried below the surface of the base substrate 102. A bit line contact strap 154 electrically couples a select one of the bit lines 120 to an associated source/drain region 150 within a corresponding strip of active area 106.

Word lines 134W having side spacers 146 thereabout are formed over the base substrate 102 and are aligned generally perpendicular to the strips of active area 106. As shown, each word line 134W crosses and is electrically coupled to an associated channel region 151 of each strip of active area 106 in the memory array 100. The word lines 134W thus define transistor gates. A plurality of charge storage devices also referred to herein as storage node capacitors 158 are also formed over the base substrate 102. One capacitor 158 is coupled to an associated source/drain region 150 within a corresponding strip of active area 106. Each capacitor 158 also has a common node connected to a cell plate common node voltage such as Vcc/2.

The memory array 100 is arranged as a plurality of memory cell pairs 101. Each memory cell pair 101 is made up of two memory cells 103. Each memory cell 103 in a memory cell pair 101 includes a capacitor 150 and a cell transistor defined by channel region 151 and the corresponding source/drain regions 150 located generally adjacent to the associated channel region 151. Each memory cell 103 in a memory cell pair 101 shares a common source/drain region 150 and bit line contact strap 154.

As memory cells are packed more densely together, it becomes advantageous to provide isolation between memory cell pairs to prevent leakage and other interference is between adjacent memory cells. Any manner can be used to provide suitable isolation. For example, islands of isolation can be formed between adjacent memory cells. Another approach is illustrated in FIG. 1. As shown, a grounded gate structure also referred to herein as isolation device 134I is positioned between memory cells 103 of two adjacent memory cell pairs 101. The isolation device 134I resembles a word line 134W and can be fabricated in the same processing steps used to form the word lines 134W. Each transistor defined by the isolation device 134I is thus referred to herein as an isolation transistor 135 to be distinguished from cell transistors of memory cells 103.

Each isolation transistor 135 is defined generally along the intersection of the isolation device 134W and each strip of active area 106. Each isolation transistor 135 has a first and second source/drain region. Each of the first and second source/drain regions is shared with an associated source/drain region 150 coupled to a capacitor 158 in adjacent memory cell pairs 101. The channel regions 151 of the isolation transistors 135 are coupled to a conductive line that is tied to a reference voltage biased to turn the isolation transistors off. Typically, this is accomplished by tying the reference voltage to zero volts or ground potential.

The isolation transistors 135 eliminate one and two dimensional encroachment problems associated with normal isolation processes. Furthermore, many photolithography problems are eliminated from the DRAM process as a result of the straight, simple design of both the active area and polysilicon in the memory cell. However, it is possible for the isolation transistor 135 to suffer from slight to extreme subthreshold leakage (subVt). The subthreshold leakage can cause data to become corrupted in one or even both of the adjacent memory cells 103. Accordingly, reference voltages other than ground potential may also be used. For example, the isolation transistors 135 can be turned off "harder" to help turn off the subthreshold leakage path by setting the reference voltage coupled to the gate to a voltage more negative than ground. For example, a reference voltage generally around −0.2 volts to −0.5 volts may be used as an alternative to the ground potential. Another technique to turn off this isolation gate is by using a p+ doped gate over the isolation device, thus the work function difference will increase the threshold voltage.

Fabrication of a Trench Bit Line

Figure 2A:
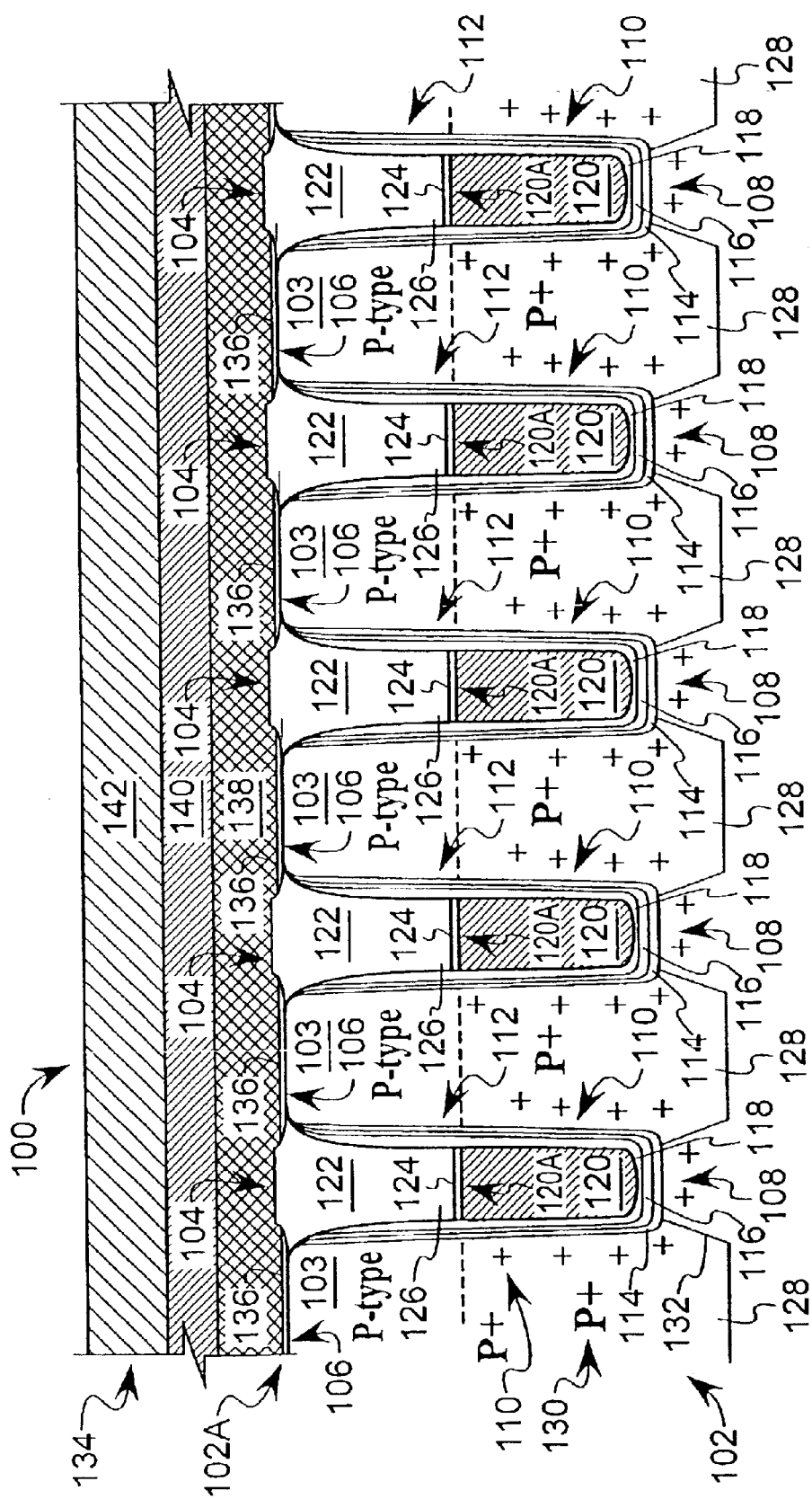
FIG. 2A is a diagrammatic section view of the memory device according to FIG. 1 taken along line A—A according to one embodiment of the present invention.

Referring to FIG. 2A, a $6F^2$ memory array 100 according to one embodiment of the present invention is formed in a base substrate 102. The base substrate 102 may comprise any semiconductor material or combination of materials as is known in the art. For example, the base substrate 102 may comprise doped or undoped silicon (Si), gallium arsenide (GaAs) or other semiconductor materials such as InP, CdS, or CdTe. The base substrate 102 may also comprise silicon on insulator (SOI) or silicon on sapphire (SOS) structures.

Figure 2B:
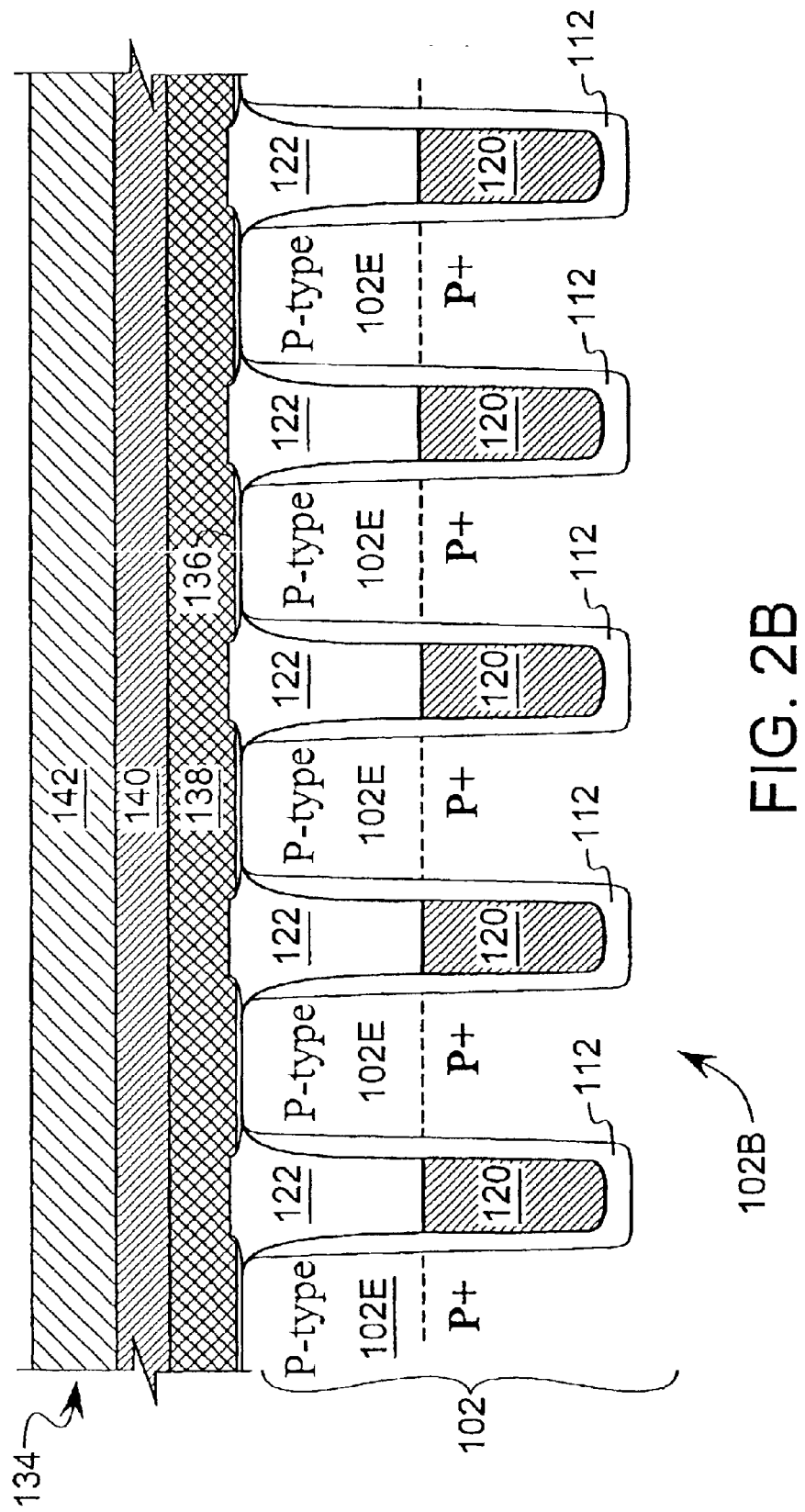
FIG. 2B is a diagrammatic section view of the memory device according to FIG. 1 taken along line A—A according to another embodiment of the present invention.

Referring briefly to FIG. 2B, the base substrate 102 according to another embodiment of the present invention is formed from a composite of several layers of material. For example, the base substrate 102 is formed from a first base layer 102E and a second base layer 102B. The first base layer 102E is an appropriately doped epitaxial layer. As shown, the epitaxial layer is doped with a P-type material. The second base layer 102B is formed from a semiconductor material such as a P+ doped semiconductor material.

Figure 2C:
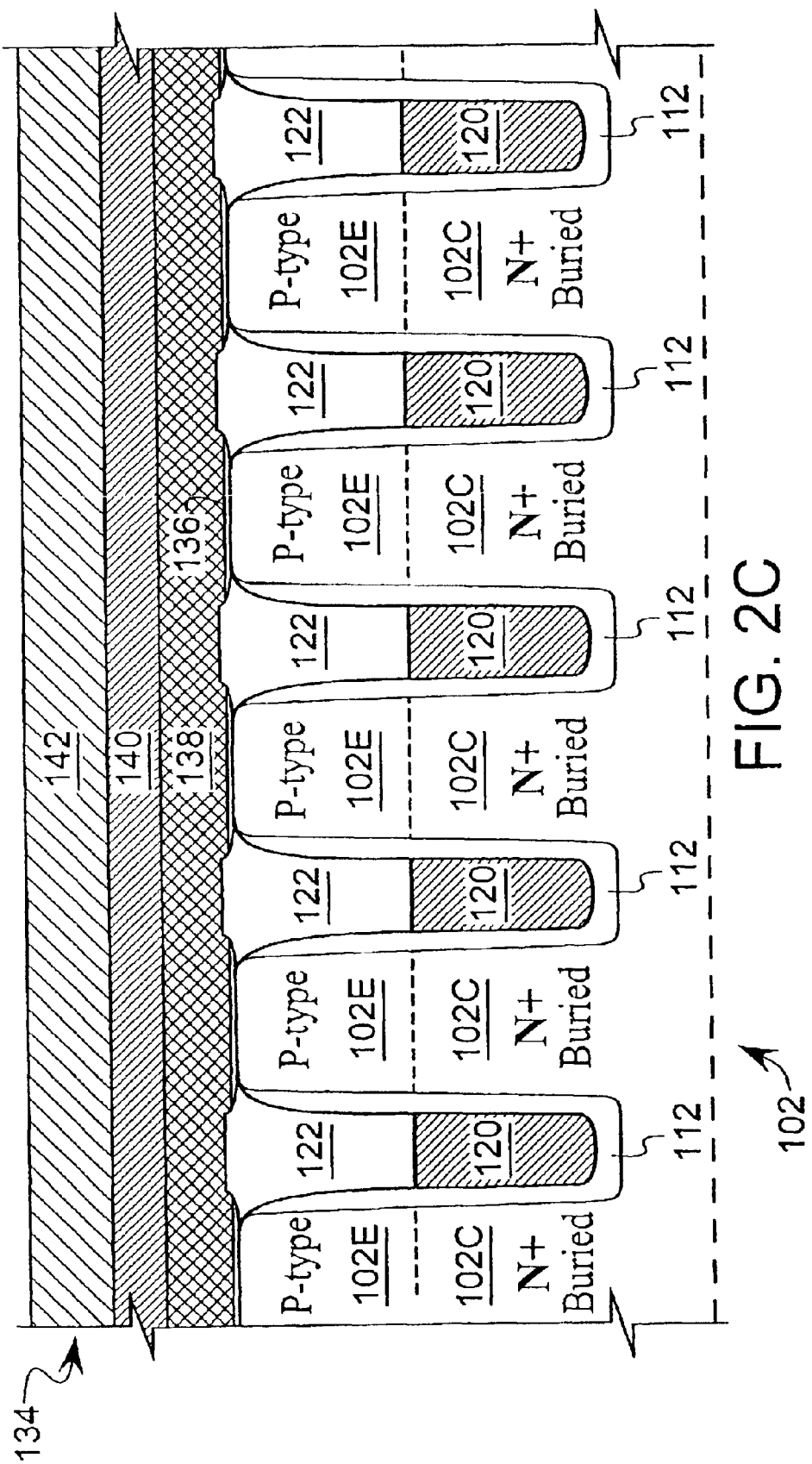
FIG. 2C is a diagrammatic section view of the memory device according to FIG. 1 taken along line A—A according to another embodiment of the present invention.

Referring briefly to FIG. 2C, the base substrate 102 according to another embodiment of the present invention includes a buried layer 102C formed such as by diffusion or ion implantation. For example, a heavily doped N-type layer may be formed by doping the buried layer 102C with an impurity such as arsenic. Alternatively, a heavily doped P-type layer may be formed by doping the buried layer 102C with an impurity such as boron. After forming the buried layer 102C, a continuous epitaxial layer 102E is formed across the top surface over the buried layer 102C.

Figure 2D:
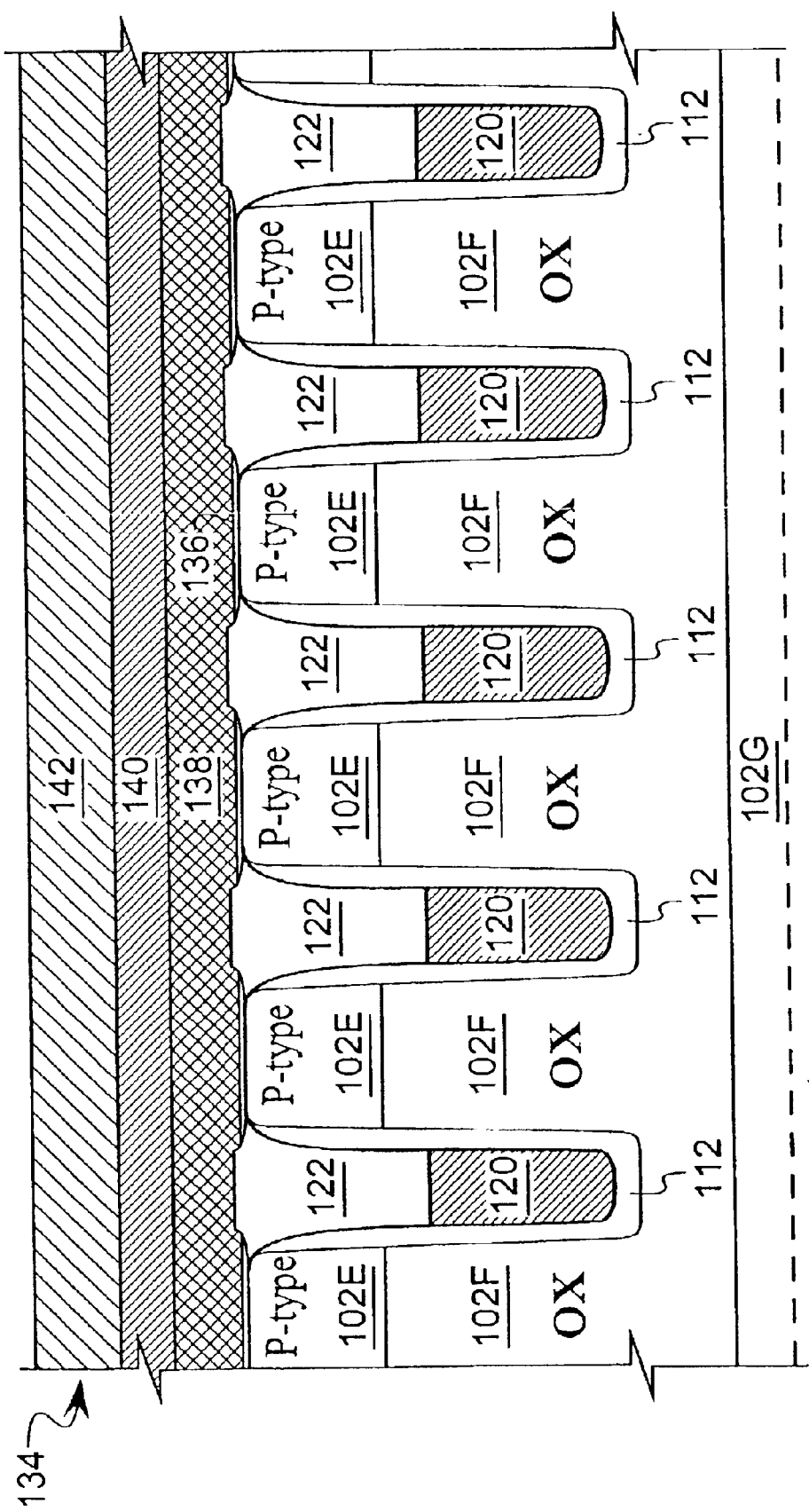
FIG. 2D is a diagrammatic section view of the memory device according to FIG. 1 taken along line A—A according to another embodiment of the present invention.

Referring briefly to FIG. 2D, the base substrate 102 according to another embodiment of the present invention is formed from a silicon layer over an insulating layer. For example, the base substrate 102 can include an oxide or insulator under silicon structure, buried oxide, or silicon on insulator structure. Under this arrangement, the base substrate 102 is formed from an insulating layer sandwiched between layers of semiconductor material. For example, the base substrate 102 is formed from a first base layer 102E and a second base layer 102F and a third base layer 102G. The first base layer 102E is formed from an appropriately doped epitaxial layer. As shown, the epitaxial layer is doped with a P-type material. The second base layer 102F is formed from a layer of insulating material, and the third base layer 102G is formed from a layer of semiconductor material.

Referring back to FIG. 2A, a plurality of isolation regions 104 are formed in the base substrate 102 near strips or regions on the surface of the base substrate 102 designated for active area 106. Each isolation region 104 includes a shallow trench isolation (STI) region as illustrated. The STI regions may be fabricated using any number of techniques. For example, using photolithography and etching, a mask is arranged to define each isolation region 104 as a trench 108 aligned generally parallel to the strips of designated for active area 106. While STI is shown, any trench forming techniques may be practiced with the present invention.

The walls 110 of the trenches 108 are substantially vertical as shown and may be formed using techniques such as anisotropic reactive ion etching. Other etching techniques may be used to form sloped or tapered sidewalls should an application dictate. Preferably, the trenches 108 are etched to a depth greater than twice the minimum realizable feature size. For example, according to one embodiment of the present invention, the trenches 108 are etched into the base substrate 102 to a depth of approximately three to four times the minimum realizable feature size.

Where the base substrate 102 includes a multilayer structure, the trenches 108 preferably extend through multiple layers. For example, referring to FIG. 2B, each trench 108 recesses through the first base layer (epitaxial layer) 102E and extends into the second base layer 102B. Similarly, referring to FIG. 2C, each trench 108 preferably extends through the epitaxial layer 102E and into the buried layer 102C. Likewise, as shown in FIG. 2D, each trench 108 extends through the epitaxial layer 102E and into the second base layer 102F of insulating material. Preferably, each trench 108 stops short of extending entirely through the second base layer 102F.

Referring back to FIG. 2A, each trench 108 includes a spacer 112 that insulates and lines at least a substantial portion of the trenches 108. For example, the spacer 112 according to one embodiment of the present invention includes a first insulating layer 114 and a second insulating layer 116. According to one embodiment of the present invention, a thermal oxidation process is used to grow the first insulating layer 114 along the sidewalls and floor of the trenches 108 to a thickness of approximately 40–80 angstroms. The second insulating layer 116 is then formed by depositing an oxide layer over the first insulating layer 114 to a thickness of approximately 170–210 Angstroms. The total thickness of the first insulating layer 114 and the second insulating layer 116 is preferably approximately ¼ the minimum realizable feature size. For example, according to one embodiment of the present invention, the total spacer thickness is approximately 250 Angstroms for a trench opening of 1,000 Angstroms.

An optional third insulating layer 118 may be formed by depositing a nitride liner over the second insulating layer 116 to a thickness of approximately 40–60 angstrom. The third insulating layer 118 may be omitted for example, if the first and second insulating layers 114, 116 are formed to a suitable thickness. Also, constraints on the thickness of the spacer 112 lining each trench 108 is relieved where the trench extends into an insulator layer such as the base substrate 102 shown with reference to FIG. 2D herein. Also, where the spacer 112 can be made relatively thinner, such as where the trench is formed in an insulating layer as shown in FIG. 2D, the trench filling aspect ratio is relatively lower than that possible with a thicker spacer 112 in a corresponding trench 108. With a lower aspect ratio, the conductivity of the bit line 120 is generally better for a given height of the conductor. For example, with reference to FIG. 2D, the spacer 112 has a total thickness of approximately 100 Angstroms.

Other techniques may be used to form the spacers 112. For example, oxides may be introduced into the trenches such as by low-pressure chemical vapor deposition (LPCVD), plasma enhanced chemical vapor deposition (PECVD), high density plasma (HDP) or high pressure oxidation (HIPOX) procedures. Chemical mechanical polishing (CMP) and etching procedures are then used to remove unwanted regions of the oxide. The trenches 108 may contain additional layers or have a geometry that differs from that shown in the Figures depending upon the isolation characteristics desired for a specific application.

A conductive line is then formed within each trench 108 defining trench buried bit lines 120. Any conventional conductive material may be used to form the bit lines 120 including materials such as titanium nitride, titanium silicide, tungsten, tungsten nitride and refractory metal suicides. The conductive line may also be formed by first depositing a barrier layer such as TiN or WNx followed by a silicide or a refractory metal such as W, Mo. For example, a first layer comprising sputtered titanium nitride is formed within each trench 108 over the spacer layer 112. A second layer is formed over the first layer using a technique such as chemical vapor deposition to deposit a conductive material such as tungsten or tungsten silicide. An optional third layer of titanium nitride polysilicon, silicon dioxide, or tungsten suicide may be formed over the second layer. While any conductive material may be used to form bit lines 120, a conductive material with a relatively high melting temperature such as a tungsten-based material including for example, tungsten/titanium nitride or tungsten/tungsten nitride is preferred.

According to one embodiment of the present invention, the bit line 120 includes a layer of either titanium nitride or tungsten nitride deposited in the trenches 108. A layer of tungsten is formed over the titanium nitride using a conventional process such as chemical vapor deposition. Chemical depositing methods typically achieve good conformality and tungsten provides good conductivity for a low resistance bit line. A chemical mechanical polish of the tungsten is then performed to planarized the bit line 120 and an etching process is used to recess the bit line 120 such that the uppermost surface 120A of the bit line 120 is recessed below the uppermost surface 102A of the base substrate 102. For example, unwanted portions of the bit line 120 may be removed using a chemical etching process such as ammonium peroxide mixture (APM). Etching in APM allows control of the etch rate, for example, by modifying the etch recipe to change the medium concentration, etch temperature, or combinations thereof. Other etching processes such as a sulfuric acid etch with hydrogen peroxide, known in the industry as Piranha etch, may also be used.

After etching back tungsten to recess the bit lines 120 below the uppermost surface 102A of the base substrate 102, an insulator capping layer 122 is formed within the trenches 108 and over the bit lines 120. For example, a first capping layer 124 such as nitride is deposited over the bit line 120. For example a layer of nitride is formed to a thickness of approximately 50–100 angstroms using a technique such as PECVD. Nitride is optional, but preferred, to protect the tungsten bit line 120 from being oxidized by subsequent thermal processes. The trench 108 is then capped off with a dielectric capping layer 126. For example, high-density plasma (HDP) may be used to cap off and top each trench 108. Other processing techniques may also be used to fill the trench 108. For example, a gap fill followed by a CMP process may be used. The dielectric capping layer 126 can also comprise other insulating materials including for example, TEOS, PSG, BSG, BPSG.

Where the base substrate 102 includes a multilayer structure, the bit lines 120 are preferably buried below the first or uppermost layer. For example, referring to FIG. 2B, the bit lines 120 are recessed below the epitaxial layer 102E and into the second base layer 102B. Similarly, referring to FIG. 2C, the bit lines 120 are recessed below the epitaxial layer 102E and are buried substantially in the buried layer 102C. Referring to FIG. 2D, the bit lines 120 are buried into the second base layer 102F. The uppermost surface 120A of the bit lines 120 preferably lie at or below the uppermost surface of the second base layer 102F. This arrangement provides good isolation because the conductive bit lines 120 are surrounded by oxide thus providing good isolation. The bit line 120 according to this embodiment of the present invention exhibits relatively lower digit capacitance since an insulator surrounds the bit lines 120. While bit line to bit line coupling may be more pronounced in this embodiment of the present invention as compared to other structures disclosed herein, such as the N+ buried layer shown 102C in FIG. 2C, however, such effects can be offset by an overall healthier sensing signal.

Referring back to FIG. 2A, a plurality of wells 128 are formed in the base substrate 102. For example, a plurality of P-type retrograde wells are formed in the base substrate defining the areas of the base substrate for the strips of active area 106. Well formation is preferably performed after forming the isolation regions 104, but may be performed prior thereto or concomitantly therewith. For example, if the isolation regions 104 are formed using STI techniques, well ion implants may be optionally embedded into the base substrate 102 through the trenches 108 prior to forming the spacers 112. One manner of forming P-type wells is to implant a P-type dopant into the base substrate 102. The P-type dopant may include for example, a trivalent element such as boron or BF2. Other implants may also optionally be performed after formation of the wells. For example, voltage threshold adjustment implants and punch through implants may be performed.

Although retrograde wells are shown in the Figures herein, other well formation techniques may be used to form wells compatible with the various embodiments of the present invention. For example, diffusion wells may be used in conjunction with, or in lieu of the retrograde wells shown. The specific application will dictate the techniques used to form the wells. Diffusion or other well forming techniques may also be formed prior to, subsequent to, or concomitantly with the formation of the isolation regions 104. For example, where the base substrate 102 includes a multilayer structure such as that illustrated with respect to FIGS. 2B, 2C and 2D, the wells 128 are preferably formed in the uppermost layer, or epitaxial layer 102E.

Referring to FIG. 2A, the trenched bit lines 120 are surrounded by silicon substrate. During operation, the bit lines 120 will swing between logic level 0 and logic level 1 as information is conveyed therealong. Logic states are typically represented by nominal voltages 0 volts and Vcc volts respectively. The voltage levels on the bit lines 120 may turn on the sidewalls of near access devices. To prevent any devices from being inadvertently turned on by the bit lines 120, the wells 128 are preferably provided with a dopant 130. Specifically, the side walls 132 of the wells 128 are doped at least adjacent to the bit line 120 buried in the trench 108. For example, a P-type impurity such as boron is doped into the base substrate 102 in a concentration that is sufficiently high to prevent inversion thus affecting cell to cell leakage. The dopant 130 can be implanted at the same time the well 128 is formed.

Referring to FIG. 2B, where the second base layer 102B includes a semiconductor material, a doping processes similar to that discussed with reference to FIG. 2A may be required. With reference to FIG. 2C, the bit line 120 is surrounded by the buried layer 102C which is already heavily doped (biased) and as such, no further doping may be required. Also, with reference to FIG. 2D, the second base layer 102F is an insulating layer and as such, the doping may be omitted.

Referring back to FIG. 2A, conductive line stacks 134 are formed over the base substrate 102 in a direction generally perpendicular to the bit lines 120 using conventional techniques. For example, the conductive lines comprise a gate oxide 136, a polysilicon gate layer 138, a conductive layer 140 such as tungsten, tungsten nitride or other conductive material and an insulating layer 142.

Figure 3:
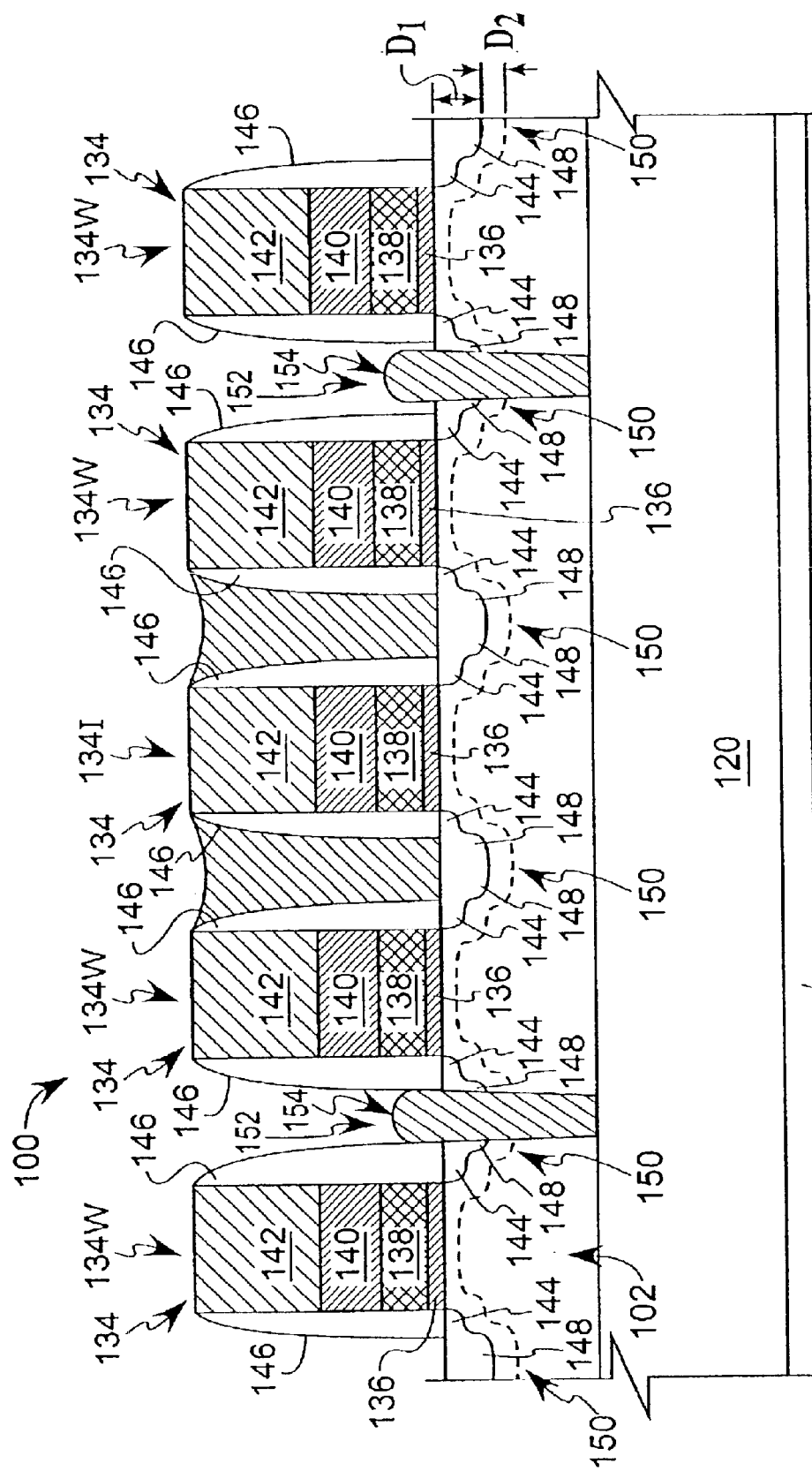
FIG. 3 is a diagrammatic cross section view of the memory device according to FIG. 1 taken along line B—B according to one embodiment of the present invention.

Referring to FIG. 3, the conductive line stacks 134 define either word lines 134W or isolation devices 134I. The general construction of word lines 134W and isolation devices 134I are essentially identical however, the isolation devices 134I are terminated by a reference voltage such as ground potential. The gate oxide 136 may be grown by thermal oxidation of the base substrate 102, or the gate oxide 136 may be formed by other conventional techniques such as chemical vapor deposition (CVD). It will be appreciated that when growing the gate oxide 136, the oxide will form on any exposed silicon surface, thus removal of portions of the gate oxide 136 from the surface of the base substrate 102 may be required as the specific application dictates.

The polysilicon gate layer 138 may be formed using any number of processing techniques including LPCVD. An optional doping of the polysilicon gate layer 138 may be performed to enhance gate performance. For example, the polysilicon gate layer 138 may be doped with a P-type impurity such as Boron. After the appropriate ion implants the polysilicon gate layer 50 may optionally be annealed.

It may be desirable to reduce channel resistance or increase speed parameters of various devices being fabricated. As shown, an ion implant is used to form optional lightly doped drain regions (LDD) 144. Alternatively, modern drain extension techniques including laterally abrupt extension formations may be used. Each conductive line stack 134 acts as a mask for the implant process, thus the LDD regions 144 "self align" with the conductive line stacks 134. The LDD regions 144 are preferably shallow in the vertical direction to prevent punch through effects when the device is off.

A spacer layer is formed over the base substrate 102 and etched back defining side spacers 146 about the conductive line stacks subsequent to forming the LDD regions 144. For example, a generally conformal spacer layer such as oxide or nitride may be deposited using a chemical vapor deposition (CVD) process. Portions of the spacer layer are then removed to define side spacers 146 against the vertical walls of the conductive line stacks 134. The side spacers 146 may have upper edges that are rounded or curved and may be formed for example, by applying a directed reactive ion beam etch downwardly onto the substrate. It shall be appreciated that other anisotropic etch processing techniques may also be used.

After forming the side spacers 146, a further ion implantation is optionally performed to further define the source/drain regions for each conductive line stack 134. The ion implant is at a higher concentration and energy than that used to form the LDD regions 144 thus the doped regions 148 are illustrated as having a deeper penetration into the base substrate 102 adjacent to the portion of the LDD regions 144 underneath the side spacers 146. The LDD regions 144 and the doped regions 148 jointly define the doped source/drain regions 150.

It will be appreciated that depending upon the intended application, one or both of the implant steps used to form the source/drain regions 150 may be eliminated from the manufacturing steps. It will further be appreciated that the source/drain regions 150 may be implanted during other processing steps. Also, the type of implant used to define the source/drain regions 150 will depend upon the type of well formed. For example, where the well is a P-type well, the source/drain regions 150 may be formed from an N-type dopant such as phosphorous or arsenic. Other types of implants such as halo implants may also optionally be performed at this time.

Once all of the ion implants have been performed, the memory device 100 may be annealed if necessary, to activate the various dopants and the ion implants heretofore discussed. The anneal process may also help remove some damage caused to the substrate 102 as the ions that have been implanted impregnate the base substrate 102. For example, a rapid thermal anneal (RTA) process or other processing techniques may be used as the technology allows and the application dictates.

Also, after the formation of the word line stack, a source/drain region re-oxidation process is typically performed to repair damage that occurs to the gate oxide near the corners of the source/drain regions as a result of etching the word lines. However, during re-oxidation, exposed tungsten is converted to tungsten trioxide gas in the presence of oxygen. Sublimation of tungsten is not self-limiting, thus the electrical performance of the tungsten may be degraded. As such, a selective oxidation is used for re-oxidation with the tungsten (W) side wall exposed.

Also, high temperature anneal and other processing steps may cause thermal expansion of the bit lines 120 buried in the trenches. Thermal expansion and other potentially adverse effects caused by high temperature processing may lead to defective formation of memory cells. Also, during fabrication, there may be concern over gate oxide integrity. One way to reduce the likelihood of damage to the memory cells is to use low temperature processing. The gate oxide/poly may be formed before isolation. Further, selective oxidation, such as that used for forming tungsten word lines may be used.

As packing density increases, effects such as Gate-Induced Drain Leakage (GIDL) may require attention. One approach to reduce GIDL problems according to the present invention is to ensure that the bit line 120 is recessed below the uppermost surface 102A of the base substrate 102 a sufficient distance. A method of reducing GIDL according to one embodiment of the present invention is to recess the bit line 120 by a distance at least as great as the sum of a storage node junction depth D1 plus a depletion width D2. The storage node junction depth DI will vary depending upon the doping characteristics of the memory device 100. As illustrated, the storage node junction depth is determined from the penetration depth of the source/drain regions 150. The depletion width D2 will be determined upon a number of factors including for example, the base substrate material and doping concentrations of the substrate and the storage source/drain regions 150 defining the storage node junction. For example, the depletion width typically extends deeper into the more lightly doped material.

The depth that the bit line 120 is recessed below the uppermost surface 102A of the base substrate 102 can be relieved if the spacer 112 is sufficiently thick. An alternative is to form the bit lines 120 in the insulating layer of a silicon on insulator structure (SOI) such as that shown in FIG. 2D.

Contact openings 152 are made through the base substrate 102 to the bit line 120 and conductive bit line straps 154 are provided to couple the bit line 120 to source/drain regions 150. The contact openings 152 may be formed using any number of techniques. For example, according to one embodiment of the present invention, a self-aligned contact etch is performed. Basically, a first etch is performed using a chemistry, such as a $C_xF_y$(x>1), or other chemistry that can etch at least partially through doped oxide. The first chemistry should have good selectivity to silicon nitride that forms the silicon nitride spacers on the conductive line stacks 134. The first chemistry should also have poor selectivity to isolation regions, thus the etch is performed through any oxide layers over the base substrate and preferably extends into the trenches. To complete the formation of the contact, a second etch having for example, a hydrogen containing fluorocarbon chemistry is used to open up a connection to the bit line 120. For example, a high density plasma (HDP) etcher, reactive ion etcher (RIE), or magnetically enhanced reactive ion etcher (MERIE) may be used to perform the self-aligned contact etch.

Referring to FIGS. 4A–4D generally, a conductive bit line contact strap 154 is formed to electrically couple the bit lines 120 to their corresponding memory cells. Initially, a portion of the spacer 112 is removed from the side wall of the trench 108 adjacent to the associated source/drain region 150 of active area for the memory cells that a bit line 120 will electrically couple to. The conductive bit line contact strap 154 extends from the bit line 120 and contacts the active area on the base substrate. As illustrated, the conductive bit line contact strap 154 extends substantially vertically from the bit line 120 and contacts a first portion 150A of the source/drain region 150 along a vertical dimension, then folds over to contact the source/drain region 150 in a second portion 150B along-the uppermost surface 102A of the base substrate 102.

Figure 4A:
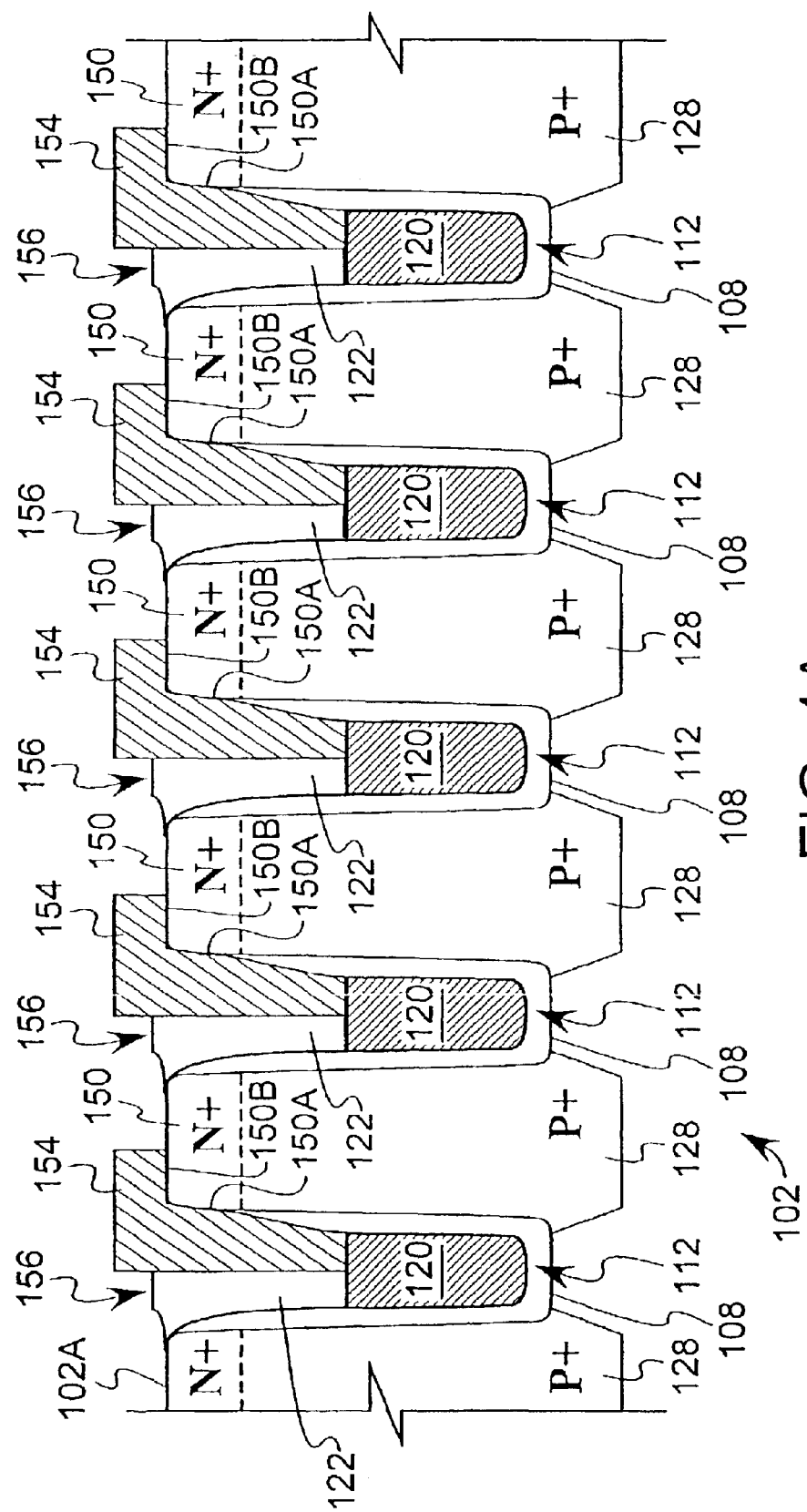
FIG. 4A is a diagrammatic section view of the memory device of FIGS. 1 and 2A taken along line C—C of FIG. 1 according to one embodiment of the present invention.
Figure 4B:
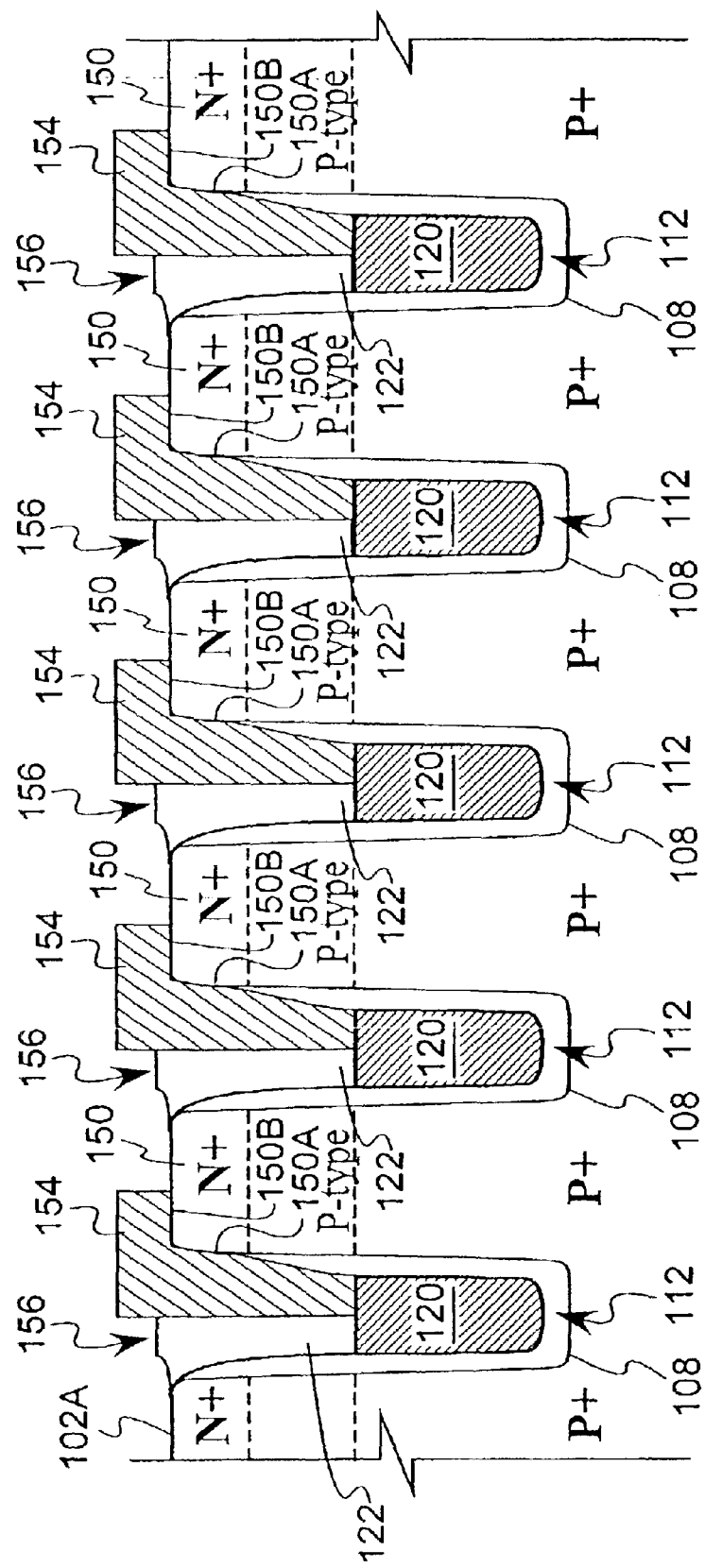
FIG. 4B is a diagrammatic section view of the memory device of FIGS. 1 and 2B taken along line C—C of FIG. 1 according to one embodiment of the present invention.
Figure 4C:
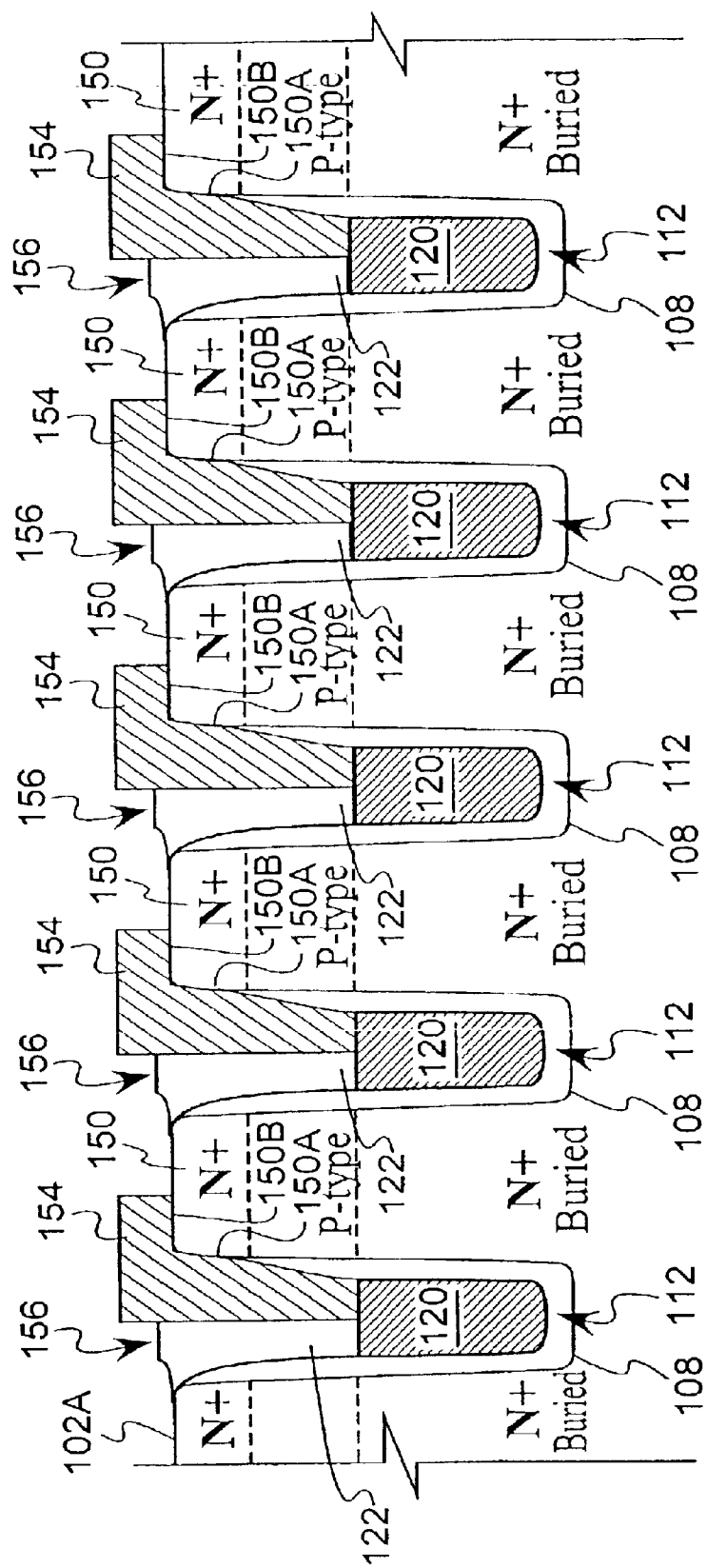
FIG. 4C is a diagrammatic section view of the memory device of FIGS. 1 and 2C taken along line C—C of FIG. 1 according to one embodiment of the present invention.
Figure 4D:
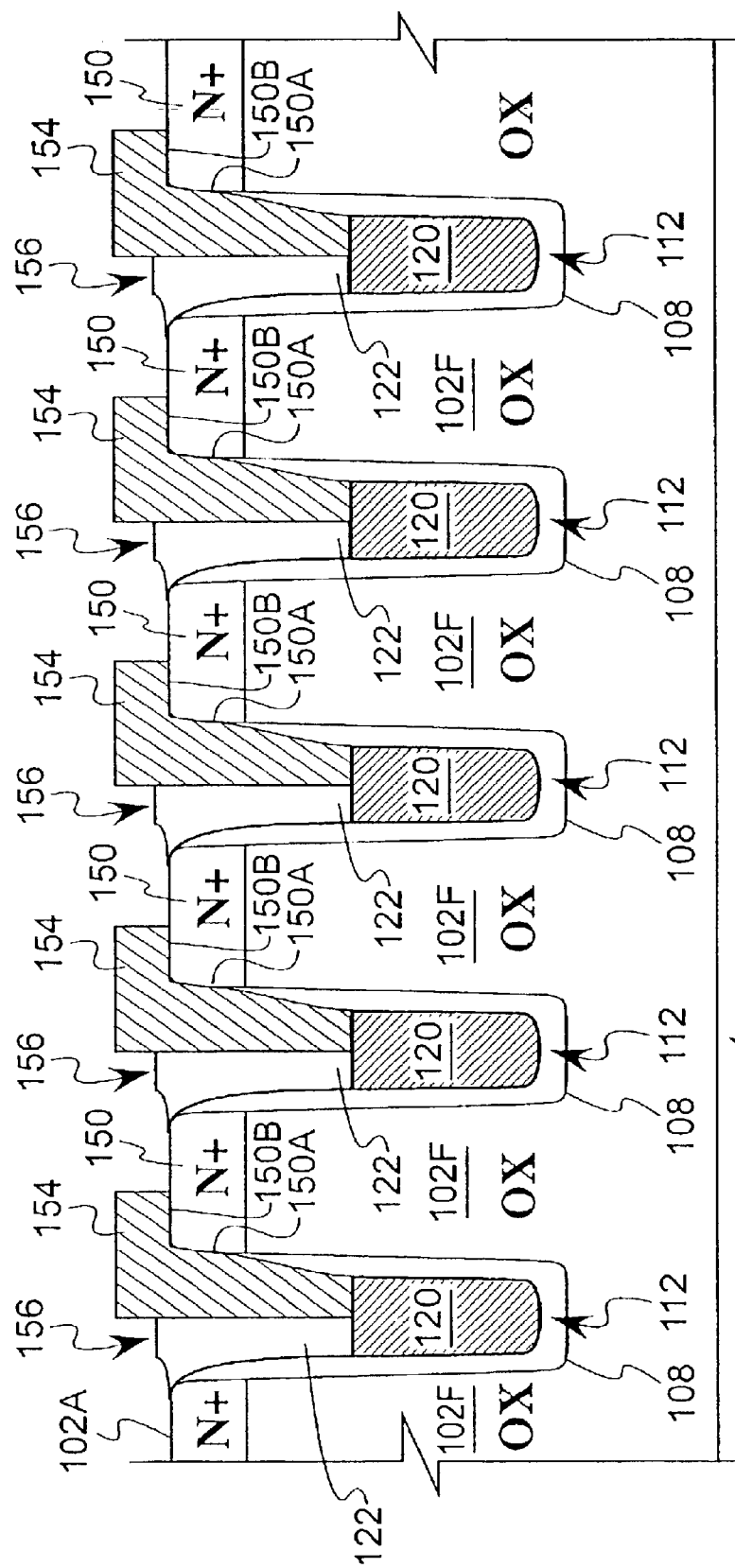
FIG. 4D is a diagrammatic section view of the memory device of FIGS. 1 and 2D taken along line C—C of FIG. 1 according to one embodiment of the present invention.

Although the conductive bit line contact strap 154 contacts on the top surface and side wall of the active area, the conductive bit line contact strap 154 does not contact the semiconductor channel. For example, as shown in FIG. 4A, the conductive bit line contact strap 154 contacts the top surface and side wall of the N+ active area (source/drain region 150). However, the spacer 112 of each trench 108 isolates the conductive bit line contact strap 154 from contacting the P-type channel formed in the wells 128 thus preventing a shorting of the bit line contact junction. The conductive bit line contact strap 154 is also preferably positioned further away from adjacent unrelated nodes. Also, referring to FIG. 4D, the problem of substrate coupling is eliminated by the second base layer 102F (SOI buried insulator layer). In this embodiment, the bit line to Bit line capacitive coupling is increased.

The conductive bit line contact strap 154 may comprise doped polysilicon, tungsten, or any other conductive material including those discussed with reference to the formation of the bit line 120. For example, TiN/W, TiSi or CoSi each have relatively low contact resistance but may not be stable for subsequent high temperature processes. As such where TiN/W, TiSi or CoSi are used to form the conductive bit line contact strap 154, lower back end processing may be required. As shown in FIG. 1, adjacent memory cells 103 of a memory cell pair 101 share a common source/drain region 150. Accordingly, a single bit line contact strap 154 electrically couples the common source/drain region 150 of two memory cells to an associated bit line adjacent thereto. According to one embodiment of the present invention, the conductive bit line contact straps 154 are formed by photo patterning such that the bit line contact to any adjacent non-related node is at least one registration tolerance away.

The absence of vias for the bit lines (because the bit lines are buried in trenches in the base substrate) allows more area for the formation of capacitors. This arrangement may be used to realize larger capacitors and hence increased capacitance and allowing for greater refresh times, a reduction in the overall size of the memory device or a combination of the two. Equivalently, for a given memory cell size, the overall stack height for cell capacitors and contacts is reduced, thus simplifying the fabrication processes.

Figure 5:
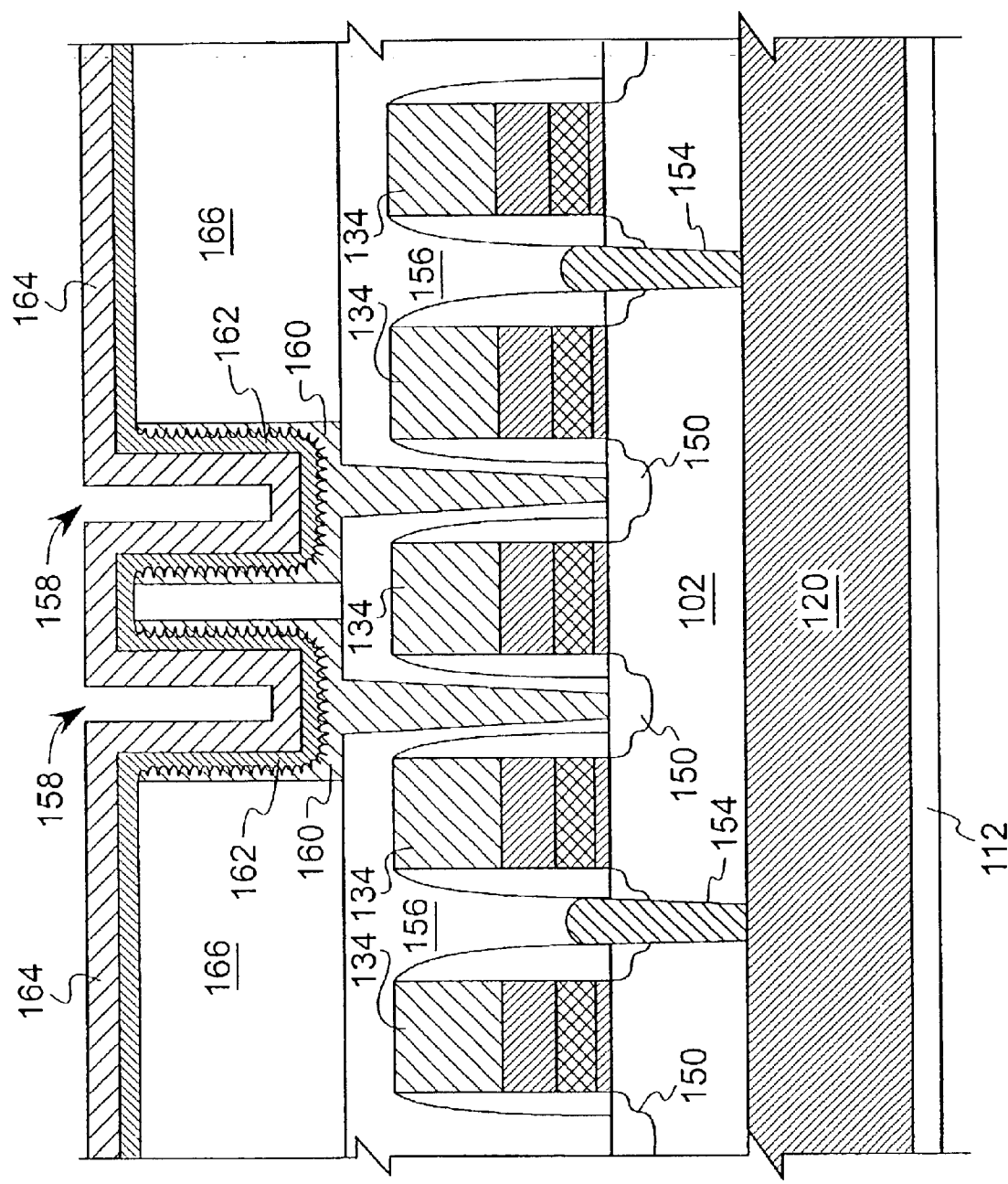
FIG. 5 is a diagrammatic section view of a memory device according to one embodiment of the present invention illustrating a memory cell pair.

Referring to FIG. 5, standard processing techniques are used to construct the remainder of the elements of the memory device. For example, a first dielectric layer 156 such as a conformal tetraethyloxysilicate (TEOS), oxide, or nitride layer is deposited over the memory device 100. Capacitors 158 are then formed over the base substrate 102.

For example, a first conductive capacitor plate layer 160 is formed over the first dielectric layer and is electrically coupled to associated source/drain regions 150. As shown, the first conductive capacitor plate layer 160 is formed from a rugged or roughed conductive material such as a hemispherically grained (HSG) polysilicon material, but other suitable conductive materials may also be used. A thin capacitor insulating layer 162 is conformally formed over the first conductive capacitor plate layer 160 and a second conductive capacitor plate layer 164 is formed over the capacitor insulating layer 162. A second dielectric layer 166 is deposited over the entire structure.

It shall be appreciated that additional processing steps may be performed to connect the circuit elements and layers of metallization. For example, back end of line wiring (BEOL) may be used to ground the isolation devices and perform any other miscellaneous operations. The BEOL wiring completes the circuits designed within the integrated circuit device. Any other semiconductor fabrication techniques may also be employed as is known in the art to complete the desired structure.

Figure 6:
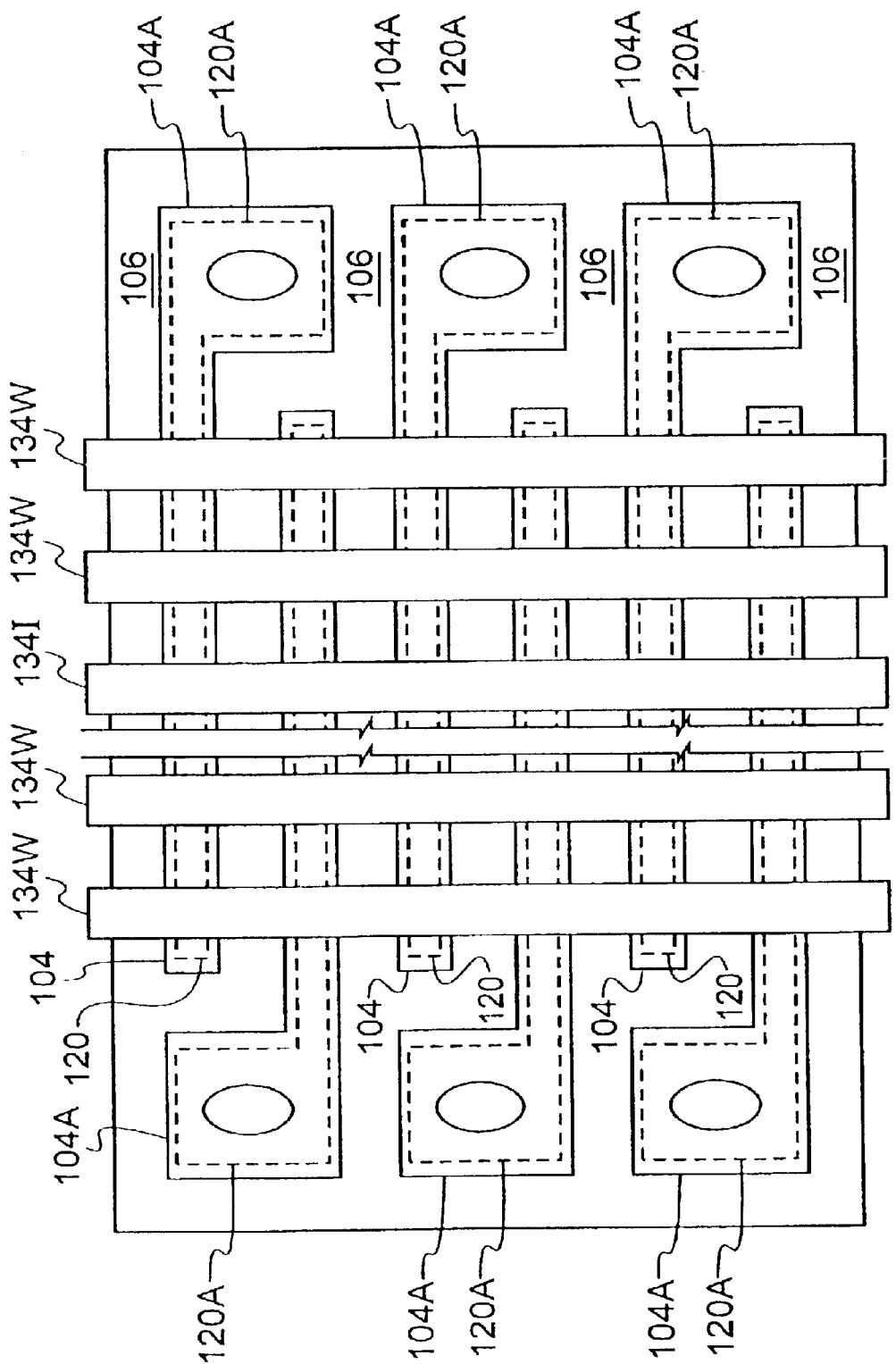
FIG. 6 is a schematic top view of a portion of a memory device with a trench bit line and a bit line contact termination according to one embodiment of the present invention.

For example, referring to FIG. 6, strips of active area 106 are positioned generally in parallel with isolation regions 104 having bit lines 120 buried therein. Word lines 134W and isolation devices 134I run generally perpendicular to the strips of active area 106 and corresponding bit lines 120. Each of the isolation regions 104 have associated therewith, a contact region 104A positioned on one end thereof. The bit lines 120 enter into the contact regions 104A and form associated conductive pads 120A therein for terminating to other devices, wiring, or other circuits. For example, an electrically conductive contact makes ohmic contact to an associated conductive pad 120A of a bit line 104.

Figure 7:
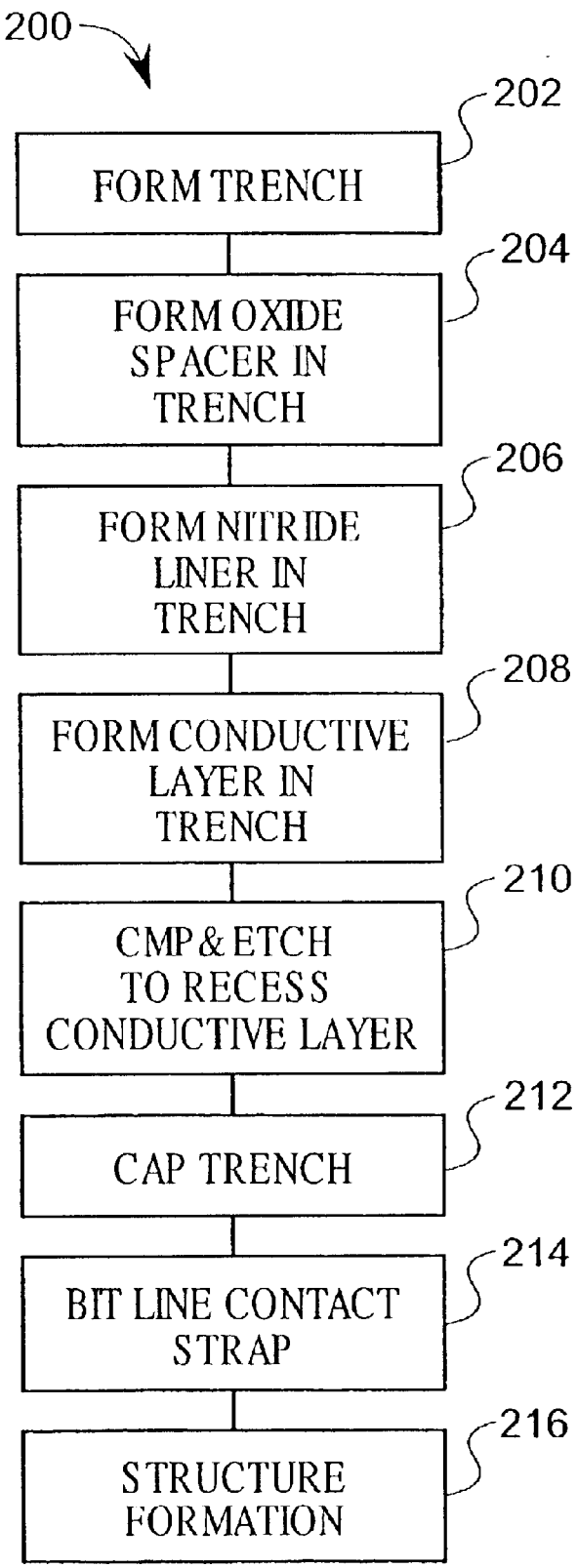
FIG. 7 is a flow chart of a method of forming a buried bit line according to one embodiment of the present invention.

Referring to FIG. 7, a method 200 for forming a buried bit line according to one embodiment of the present invention is summarized. A plurality of trenches are formed in a base substrate at step 202. An oxide layer is formed in each trench so as to form a liner over the walls of the trench at step 204. The oxide layer may be formed from one or more separate oxide processing techniques. A nitride liner is then formed over the oxide layer at step 206 such that a trench spacer is defined by the combination of the oxide and the nitride layers. A conductive layer is formed in each trench to define bit lines at step 208. A etching processes is performed to recess the bit line below the surface of the base substrate at step 210 and a dielectric capping layer is formed over the trench so as to cover and isolate the bit lines at step 212.

A portion of the trench spacer is removed exposing an active area of the base substrate and a conductive bit line contact strap is formed coupling the bit line to an active area portion of the base substrate. The bit line contact strap is coupled to the base substrate both vertically where the trench spacer has been removed and on the surface of the base substrate at step 214. Remaining structure formation including for example, the formation of word lines, capacitors, layers of metallization and wiring are performed at step 216 to complete the memory device.

Figure 8:
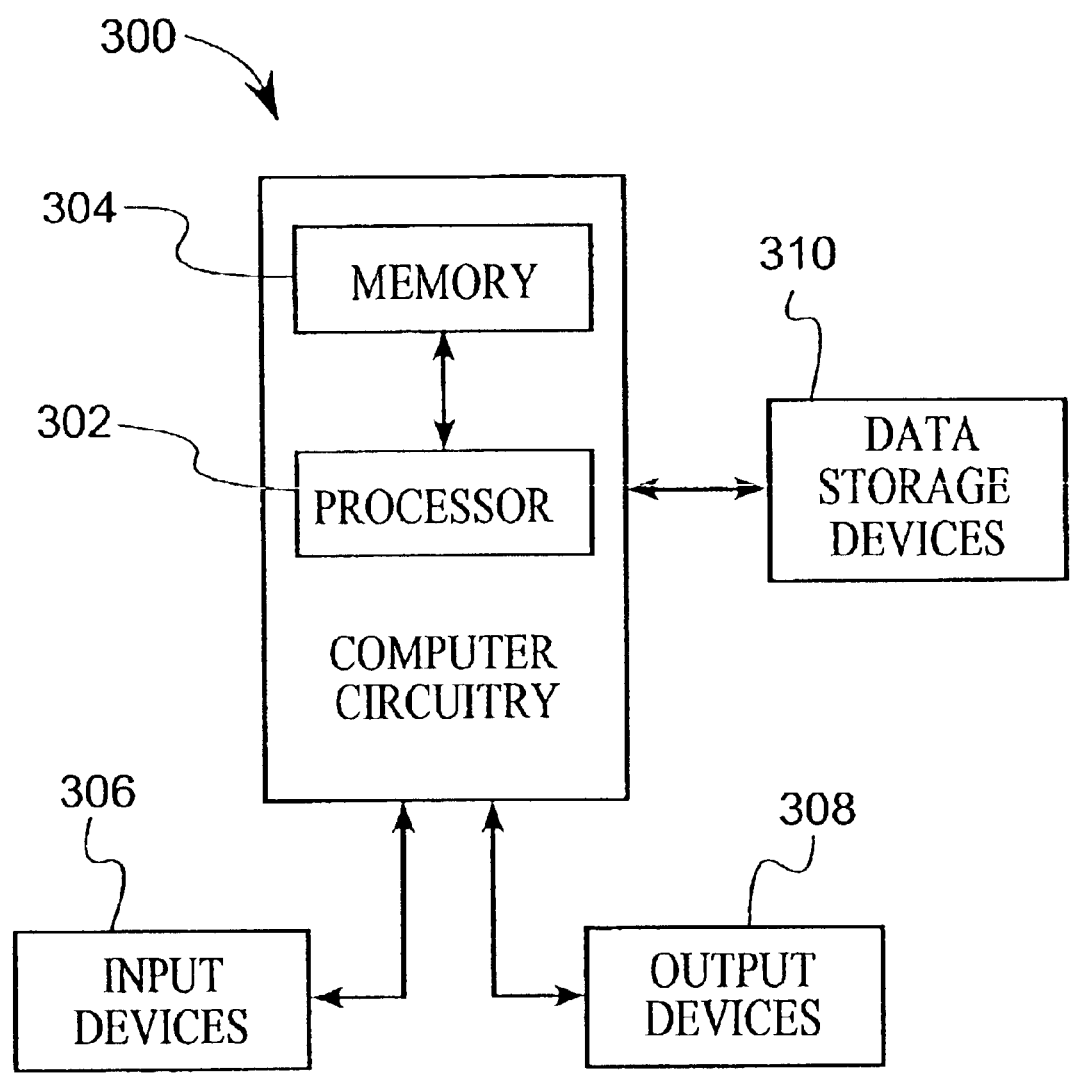
FIG. 8 is a schematic illustration of a computer system incorporating a memory device according to one embodiment of the present invention.

Referring to FIG. 8, a memory device according to the present invention can be used in computing device. As illustrated, a computing device 300 includes a processor 302 communicably coupled to a memory device 304 constructed according to the present invention and having trench buried bit lines. The processor is further communicably coupled to input devices 306, output devices 308 and data storage devices 310.

Having described the invention in detail and by reference to preferred embodiments thereof, it will be apparent that modifications and variations are possible without departing from the scope of the invention defined in the appended claims.

What is claimed is:

1. A memory cell comprising:
   a base substrate having an uppermost surface;
   a strip of active area formed on said uppermost surface of said base substrate;
   a trench formed in said base substrate generally along side and adjacent to said strip of active area;
   a spacer within said trench lining at least a portion of the walls of said trench;
   a conductive bit line positioned within said trench such that an uppermost surface of said conductive bit line is recessed below an uppermost surface of said base substrate;
   a cap formed within said trench over said conductive bit line;
   a transistor formed in said active area;
   a word line coupled to said transistor defining a transistor gate;
   a bit line strap that couples said conductive bit line to said active area at least about said uppermost surface of said substrate; and
   a capacitor over said substrate and electrically coupled to said transistor.

2. The memory cell according to claim 1, wherein said bit line strap further couples to said first source/drain region through said side wall of said trench.

3. The memory cell according to claim 1, wherein said bit line is recessed below said uppermost surface of said base substrate by at least a first distance defined by the combined distances of a junction depth plus a depletion width of said transistor.

4. A memory cell comprising:
   a base substrate having an a first base layer and a second base layer;
   a strip of active area formed on said first base layer of said base substrate;
   a trench formed in said base substrate generally along side and adjacent to said strip of active area;
   a spacer within said trench lining at least a portion of the walls of said trench;
   a conductive bit line positioned within said trench such that an uppermost surface of said conductive bit line is recessed at least to an uppermost surface of said second base layer of said base substrate;
   a cap formed within said trench over said conductive bit line;
   a transistor formed in said active area;
   a word line coupled to said transistor defining a transistor gate;
   a bit line s that couples said conductive bit line to said active area at least about said uppermost surface of said substrate; and
   a capacitor over said substrata and electrically coupled to said transistor.

5. The memory cell according to claim 4, wherein said conductive bit line is processed below said uppermost surface of said second base layer.

6. The memory cell according to claim 4, wherein said bit line is recessed below an uppermost surface of said base substrate by at least a first distance defined by the combined distances of a junction depth plus a depletion width of said transistor.

7. The memory cell according to claim 4, wherein said first base layer comprises an epitaxial layer.

8. The memory cell according to claim 4, wherein said second base layer comprises a P+ doped semiconductor material.

9. The memory cell according to claim 4, wherein said first base layer comprises a P+ epitaxial layer and said second base layer comprises a P+ doped semiconductor material.

10. The memory cell according to claim 4, wherein said first base layer is doped with a fast type impurity and said second base layer comprises a buried layer doped with a second type impurity.

11. The memory cell according to claim 4, wherein said first base layer comprises a P-type semiconductor material and said second base layer comprises an N+ buried layer.

12. The memory cell according to claim 4, wherein in said first base layer comprises a semiconductor layer and said second base layer comprises an insulator layer.

13. The memory cell according to claim 4, wherein said bit line strap further couples to said first source/drain region through said side wall of said trench and is isolated from the active area by an insulative spacer.

14. A memory cell comprising:
   a base substrate having an a first base layer of semiconductor material formed over a second base layer of an insulating material;
   a strip of active area formed on said first base layer of said base substrate;
   a trench formed in said base substrate generally along side and adjacent to said strip of active area;
   a spacer within said trench lining at least a portion of the walls of said trench;
   a conductive bit line positioned within said trench such that an uppermost surface of said conductive bit line is recessed below an uppermost surface of said second base layer of said base substrate;
   a cap formed within said trench over said conductive bit line;
   a transistor formed in said active area;
   a word line coupled to said transistor defining a transistor gate;
   a bit line strap that couples said conductive bit line to said active area at least about said uppermost surface of said substrate; and
   a capacitor over said substrate and electrically coupled to said transistor.

15. The memory cell according to claim 14, wherein said bit line is recessed below an uppermost surface of said base substrate by at least a first distance defined by the combined distances of a junction depth plus a depletion width of said transistor.

16. A memory cell comprising:
   a base substrate having an uppermost surface;
   a first type well formed within said base substrate;
   a transistor formed in said first type well comprising a channel separated between a first source/drain region and a second source/drain region;
   a word line coupled to said channel of said transistor defining a transistor gate;
   a trench formed in said base substrate;
   a spacer within said trench lining at least a portion of the walls of said trench;
   a conductive bit line positioned within said trench and recessed below said uppermost surface of said base substrate;

a cap formed within said trench over said conductive bit line;

a bit line strap that couples said conductive bit line to said first source/drain region of said transistor at least about said uppermost surface of said substrate; and a capacitor over said substrate and electrically coupled to said second source/drain region.

17. The memory cell according to claim 16, wherein said bit line is recessed below said uppermost surface of said base substrate by at least a first distance defined by the combined distances of a junction depth plus a depletion width of said transistor.

18. The memory cell according to claim 16, wherein said trench is etched to a depth greater than twice a minimum realizable feature size.

19. The memory cell according to claim 16, wherein said spacer comprises:

a first layer of oxide;

a second layer of oxide over said first layer of oxide; and a nitride layer over said second layer of oxide.

20. The memory cell according to claim 16, wherein said spacer is formed so as to have a thickness of approximately one fourth the minimum realizable feature size.

21. The memory cell according to claim 16, where said conductive bit line comprises a layer of titanium alloy containing tungsten.

22. The memory cell according to claim 16, wherein said cap layer comprises:

a capping layer of nitride over said conductive bit line; and a capping insulating material of HDP over said nitride.

23. The memory cell according to claim 16, wherein said bit line strap further couples to said first source/drain region through a side wall of said trench.

24. A memory cell comprising:

a base substrate having an a first base layer of semiconductor material and a second base layer of semiconductor material;

a transistor formed on said base substrate comprising a channel separated between a first source/drain region and a second source/drain region;

a word line coupled to said channel of said transistor defining a transistor gate;

a trench formed in said base substrate passing generally adjacent to said transistor;

a spacer within said trench lining at least a portion of the walls of said trench;

a conductive bit line positioned within said trench such that an uppermost surface of said conductive bit line is recessed at least to an uppermost surface of said second base layer of said base substrate;

a cap formed within said trench over said conductive bit line;

a bit line strap that couples said conductive bit line to said first source/drain region of said transistor at least about said uppermost surface of said substrate; and a capacitor over said substrate and electrically coupled to said second source/drain region.

25. The memory cell according to claim 24, wherein said bit line is recessed below said base substrate by at least a first distance defined by the combined distances of a junction depth plus a depletion width of said transistor.

26. The memory cell according to claim 24, wherein said trench is etched to a depth greater than twice a minimum realizable feature size.

27. The memory cell according to claim 24, wherein said spacer comprises:

a first layer of oxide;

a second layer of oxide over said first layer of oxide; and a nitride layer over said second layer of oxide.

28. The memory cell according to claim 24, wherein said spacer is formed so as to have a thickness of approximately one fourth the minimum realizable feature size.

29. The memory cell according to claim 24, wherein said conductive bit line comprises a layer of titanium alloy containing tungsten.

30. The memory cell according to claim 24, wherein said cap layer comprises:

a capping layer of nitride over said conductive bit line; and a capping insulating material of HDP over said nitride.

31. The memory cell according to claim 24, wherein said bit line strap further couples to said first source/drain region through a side wall of said trench.

32. A memory cell comprising:

a base substrate having an a first base layer of semiconductor material over a second base layer of insulating material;

a transistor formed on said base substrate comprising a channel separated between a first source/drain region and a second source/drain region;

a word line coupled to said channel of said transistor defining a transistor gate;

a trench formed in said base substrate passing generally adjacent to said transistor;

a spacer within said trench lining at least a portion of the walls of said trench;

a conductive bit line positioned within said trench such that an uppermost surface of said conductive bit line is recessed below an uppermost surface of said second base layer of said base substrate;

a cap formed within said trench over said conductive bit line;

a bit line strap that couples said conductive bit line to said first source/drain region of said transistor at least about said uppermost surface of said substrate; and a capacitor over said substrate and electrically coupled to said second source/drain region.

33. The memory cell according to claim 32, wherein said bit line is recessed below said base substrate by at least a first distance defined by the combined distances of a junction depth plus a depletion width of said transistor.

34. The memory cell according to claim 32, wherein said trench is etched to a depth greater than twice a minimum realizable feature size.

35. The memory cell according to claim 32, wherein said conductive bit line comprises a layer of titanium alloy containing tungsten.

36. The Memory cell according to claim 32, wherein said cap layer comprises:

a capping layer of nitride over said conductive bit line; and a capping insulating material of HDP over said nitride.

37. The memory cell according to claim 32, wherein said bit line strap further couples to said first source/drain region through a side wall of said trench.

38. A memory cell comprising:

a base substrate having an uppermost surface;

a p-type well formed within said base substrate;

a transistor formed in said p-type well comprising a channel separated between a first source/drain region and a second source/drain region;

a word line coupled to said channel of said transistor defining a transistor gate;

a trench formed in said base substrate;

a spacer within said trench lining at least a portion of the walls of said trench;

a conductive bit line positioned within said trench and recessed below said uppermost surface of said base substrate;

a cap formed within said trench over said conductive bit line;

a bit line strap that couples said conductive bit line to said first source/drain region of said transistor at least about said uppermost surface of said substrate; and a capacitor over said substrate and electrically coupled to said second source/drain region.

39. A memory cell comprising:

a base substrate having an uppermost surface;

a first type well formed within said base substrate;

a transistor formed in said first type well comprising a channel separated between a first source/drain region and a second source/drain region;

a word line coupled to said channel of said transistor defining a transistor gate;

a trench formed in said base substrate;

a spacer within said trench lining at least a portion of the walls of said trench;

a conductive bit line positioned within said trench and recessed below said uppermost surface of said base substrate;

a first type doping in said first type well at least about a portion of said well adjacent said portion of said trench containing said conductive bit line, said first type doping of the same type as said first type well and in a concentration sufficiently high to prevent inversion;

a cap formed within said trench over said conductive bit line;

a bit line strap that couples said conductive bit line to said first source/drain region of said transistor at least about said uppermost surface of said substrate; and a capacitor over said substrate and electrically coupled to said second source/drain region.

40. The memory cell according to claim 36, wherein said bit line strap further couples to said first source/drain region through said side wall of said trench.

41. A memory cell comprising:

a base substrate having an uppermost surface;

a P-type well formed within said base substrate;

an N-type active area formed within said P-type well a trench formed in said base substrate passing generally adjacent to said N-type active area;

a spacer within said trench lining at least a portion of the walls of said trench;

a conductive bit line positioned within said trench and recessed below said uppermost surface of said base substrate;

an insulating cap formed within said trench over said conductive bit line; and a bit line strap that couples said conductive bit line to said N-type active area about said uppermost surface of said substrate and through said side wall of said trench.

42. A memory cell comprising:

a base substrate having an uppermost surface;

a strip of active area formed on said uppermost surface of said base substrate;

a transistor formed in said active area comprising a channel separated between a first source/drain region and a second source/drain region;

a word line coupled to said channel of said transistor defining a transistor gate;

a trench formed in said base substrate generally along side and adjacent to said strip of active area;

a spacer within said trench lining at least a portion of the walls of said trench;

a conductive bit line positioned within said trench such that an uppermost surface of said conductive bit line is recessed within said substrate at least a first distance defined by the combined distances of a junction depth plus a depletion width of said transistor;

a cap formed within said trench over said conductive bit line;

a bit line strap that couples said conductive bit line to said first source/drain region of said transistor at least about said uppermost surface of said substrate; and a capacitor over said substrate and electrically coupled to said second source/drain region.

43. A memory cell comprising:

a base substrate having an uppermost surface;

a strip of active area formed on said uppermost surface of said base substrate;

a transistor formed in said active area comprising a channel separated between a first source/drain region and a second source/drain region;

a word line coupled to said channel of said transistor defining a transistor gate;

a trench formed in said base substrate generally parallel to and along side said strip of active area;

a spacer within said trench lining at least a portion of the walls of said trench;

a conductive bit line positioned within said trench and recessed below said uppermost surface of said base substrate a distance arranged to substantially eliminate a gate induced drain leakage of said transistor;

a cap formed within said trench over said conductive bit line;

a bit line strap that couples said conductive bit line to said first source/drain region of said transistor at least about said uppermost surface of said substrate; and a capacitor over said substrate and electrically coupled to said second source/drain region.

44. A memory cell pair comprising:

a base substrate having an a first base layer and a second base layer;

a strip of active area formed on said first base layer of said base substrate;

a pair of transistors formed in said strip of active area, each of said transistors sharing a common first source/drain region, a channel separated between said common first source/drain region and a second source/drain region;

a word line coupled to said channel of each one of said pair of transistors;

a trench formed in said base substrate;

a spacer within said trench lining at least a portion of the walls of said trench;

a conductive bit line positioned within said trench and recessed below an uppermost surface of said second base layer;

a cap formed within said trench over said conductive bit line;

a bit line strap that couples said conductive bit line to said common first source/drain region of said transistor at least about said uppermost surface of said base substrate; and a pair of capacitors each formed over said substrate and electrically coupled to an associated one of said second source/drain regions.

45. A memory cell pair comprising:

a base substrate having an a first base layer of semiconductor material formed over a second base layer of an insulating material;

a strip of active area formed on said first base layer of said base substrate;

a pair of transistors formed in said strip of active area, each of said transistors sharing a common first source/drain region, a channel separated between said common first source/drain region and a second source/drain region;

a word line coupled to said channel of each one of said pair of transistors;

a trench formed in said base substrate;

a spacer within said trench lining at least a portion of the walls of said trench;

a conductive bit line positioned within said trench such that an uppermost surface of said conductive bit line is recessed below an uppermost surface of said second base layer of said base substrate;

a cap formed within said trench over said conductive bit line;

a bit line strap that couples said conductive bit line to said common first source/drain region of said transistor at least about said uppermost surface of said base substrate; and a pair of capacitors each formed over said substrate and electrically coupled to an associated one of said second source/drain regions.

46. A memory array comprising:

a base substrate having an uppermost surface;

a strip of active area formed on said base substrate;

a plurality of pairs of transistors formed in said strip of active area, each of said pairs of transistors sharing a common first source/drain region and further comprising a channel separated between said common first source/drain region and a second source/drain region;

a word line coupled to said channel of each transistor defining a transistor gate;

a trench formed in said base substrate;

a spacer within said trench lining at least a portion of the walls of said trench;

a conductive bit line positioned within said trench and recessed below said uppermost surface of said base substrate;

a cap formed within said trench over said conductive bit line;

a plurality of bit line straps, each bit line strap coupled between said conductive bit line and an associated one of said common first source/drain regions of said transistor at least about said uppermost surface of said substrate; and a plurality of capacitors formed over said substrate, each capacitor coupled to an associated one of said second source/drain regions.

47. A memory cell array comprising:

a base substrate having an uppermost surface;

a first strip of active area doped to define at least a first source/drain region, a first channel, a second source/drain region, a second channel, a third source/drain region, a third channel, a fourth source/drain region, a fourth channel, a fifth source/drain region, a fifth channel and a sixth source/drain region;

a first trench formed in said base substrate generally parallel to said first strip of active area;

a first bit line within first trench such that an uppermost surface of said bit line is recessed below said uppermost surface of said base substrate;

a capping layer within said trench over said bit line;

a first word line coupled to said first channel such that a first transistor is defined by said first source/drain region, said first channel and said second source/drain region;

a first capacitor formed over said base substrate and coupled to said first source drain region;

a second word line coupled to said second channel such that a second transistor is defined by said second source/drain region, said second channel and said third source/drain region;

a second capacitor formed over said base substrate and coupled to said third source/drain region;

a first conductive layer coupled to said third channel and tied to a first reference voltage;

a third word line coupled to said fourth channel such that a third transistor is defined by said fourth source/drain region, said fourth channel and said fifth source/drain region;

a third capacitor formed over said base substrate and coupled to said fourth source/drain region;

a fourth word line coupled to said fifth channel such that a fourth transistor is defined by said fifth source/drain region, said fifth channel and said sixth source/drain region;

a fourth capacitor formed over said base substrate and coupled to said sixth source/drain region;

a first bit line contact strap coupled between said bit line and said second source/drain region at least about said uppermost surface of said substrate; and a second bit line contact strap coupled between said bit line and said fifth source/drain region at least about said uppermost surface of said substrate.

48. The memory cell according to claim 47, wherein said first reference voltage comprises ground potential.

49. A computer system comprising:

a processor;

at least one storage device communicably coupled to said processor;

at least one input/output device communicably coupled to said processor a memory device communicably coupled to said processor, said memory device having at least one memory cell comprising:
  a base substrate having an uppermost surface;
  a strip of active area formed on said base substrate;
  a transistor formed in said strip of active area comprising a channel separated between a first source/drain region and a second source/drain region;
  a word line coupled to said channel of said transistor defining a transistor gate;
  a trench formed in said base substrate;
  a spacer within said trench lining at least a portion of the walls of said trench;
  a conductive bit line positioned within said trench and recessed below said uppermost surface of said base substrate;
  a cap formed within said trench over said conductive bit line;
  a bit line strap that couples said conductive bit line to said first source/drain region of said transistor at least about said uppermost surface of said substrate; and
  a capacitor over said substrate and electrically coupled to said second source/drain region.

* * * * *

UNITED STATES PATENT AND TRADEMARK OFFICE
CERTIFICATE OF CORRECTION

PATENT NO. : 6,734,482 B1
DATED : May 11, 2004
INVENTOR(S) : Tran et al.

It is certified that error appears in the above-identified patent and that said Letters Patent is hereby corrected as shown below:

Column 13,
Line 55, "line s" should read -- line strap --
Line 58, "said substrata" should read -- said substrate --
Line 61, "processed" should read -- recessed --

Column 15,
Line 25, "where" should read -- wherein --

Column 20,
Line 29, "source drain region" should read -- source/drain region --

Signed and Sealed this

Fourteenth Day of December, 2004

JON W. DUDAS
*Director of the United States Patent and Trademark Office*

UNITED STATES PATENT AND TRADEMARK OFFICE
CERTIFICATE OF CORRECTION

PATENT NO. : 6,734,482 B1  Page 1 of 1
DATED : May 11, 2004
INVENTOR(S) : Tran et al.

It is certified that error appears in the above-identified patent and that said Letters Patent is hereby corrected as shown below:

<u>Column 11,</u>
Line 17, "along-the" should read -- along the --.

Signed and Sealed this

Twenty-first Day of June, 2005

JON W. DUDAS
*Director of the United States Patent and Trademark Office*